United States Patent

Steinberg et al.

[11] 4,368,092
[45] Jan. 11, 1983

[54] APPARATUS FOR THE ETCHING FOR SEMICONDUCTOR DEVICES

[75] Inventors: George N. Steinberg; Alan R. Reinberg, both of Westport, Conn.

[73] Assignee: The Perkin-Elmer Corporation, Norwalk, Conn.

[21] Appl. No.: 290,270

[22] Filed: Aug. 5, 1981

Related U.S. Application Data

[63] Continuation-in-part of Ser. No. 250,364, Apr. 2, 1981.

[51] Int. Cl.$^3$ .................. C23F 1/00; C23C 15/00
[52] U.S. Cl. ................. 156/345; 204/192 E; 204/298; 156/643; 422/183.04
[58] Field of Search .............. 204/192 E, 298; 156/345, 643; 250/531

[56] References Cited

U.S. PATENT DOCUMENTS

| | | | |
|---|---|---|---|
| 3,873,884 | 3/1975 | Gabriel | 315/267 |
| 4,123,663 | 10/1978 | Horiike | 250/531 |
| 4,138,306 | 2/1979 | Niwa | 156/345 |
| 4,160,690 | 7/1979 | Shibagaki et al. | 156/643 |
| 4,175,235 | 11/1979 | Niwa et al. | 250/542 |
| 4,233,109 | 11/1980 | Nishizawa | 156/643 |
| 4,284,489 | 8/1981 | Weber | 204/298 |

FOREIGN PATENT DOCUMENTS

| | | | |
|---|---|---|---|
| 52-16482 | 2/1977 | Japan | 204/298 |
| 53-84684 | 7/1978 | Japan | 156/345 |
| 53-135845 | 11/1978 | Japan | 156/345 |
| 55-118636 | 9/1980 | Japan | 156/345 |

Primary Examiner—Aaron Weisstuch
Attorney, Agent, or Firm—S. A. Giarratana; E. T. Grimes; T. P. Murphy

[57] ABSTRACT

Apparatus for the etching of semiconductor devices which includes, in combination, an etching chamber containing the semiconductor device to be etched, an electrodeless etching plasma forming chamber having an inlet connected to a source of continuously flowing etching gas and having an outlet connected to said etching chamber in fluid flow communication; a helical inductive resonator coupler for coupling a source of R.F. electrical power into the electrodeless plasma forming chamber for continuously forming etching plasma from the etching gas flowing therethrough; this inductive resonator coupler including a grounded hollow cylinder of electrically conductive material, with a grounded base member at one end; a helically coiled wire conductor concentrically mounted within the cylinder and spaced from the inner walls thereof; the plasma forming chamber being mounted substantially concentrically within the coil, the end of the coil toward the base member being grounded; and an electrical coupling for applying into the coil an R.F. source of electrical power at a position near, but spaced from, the grounded end thereof.

7 Claims, 1 Drawing Figure

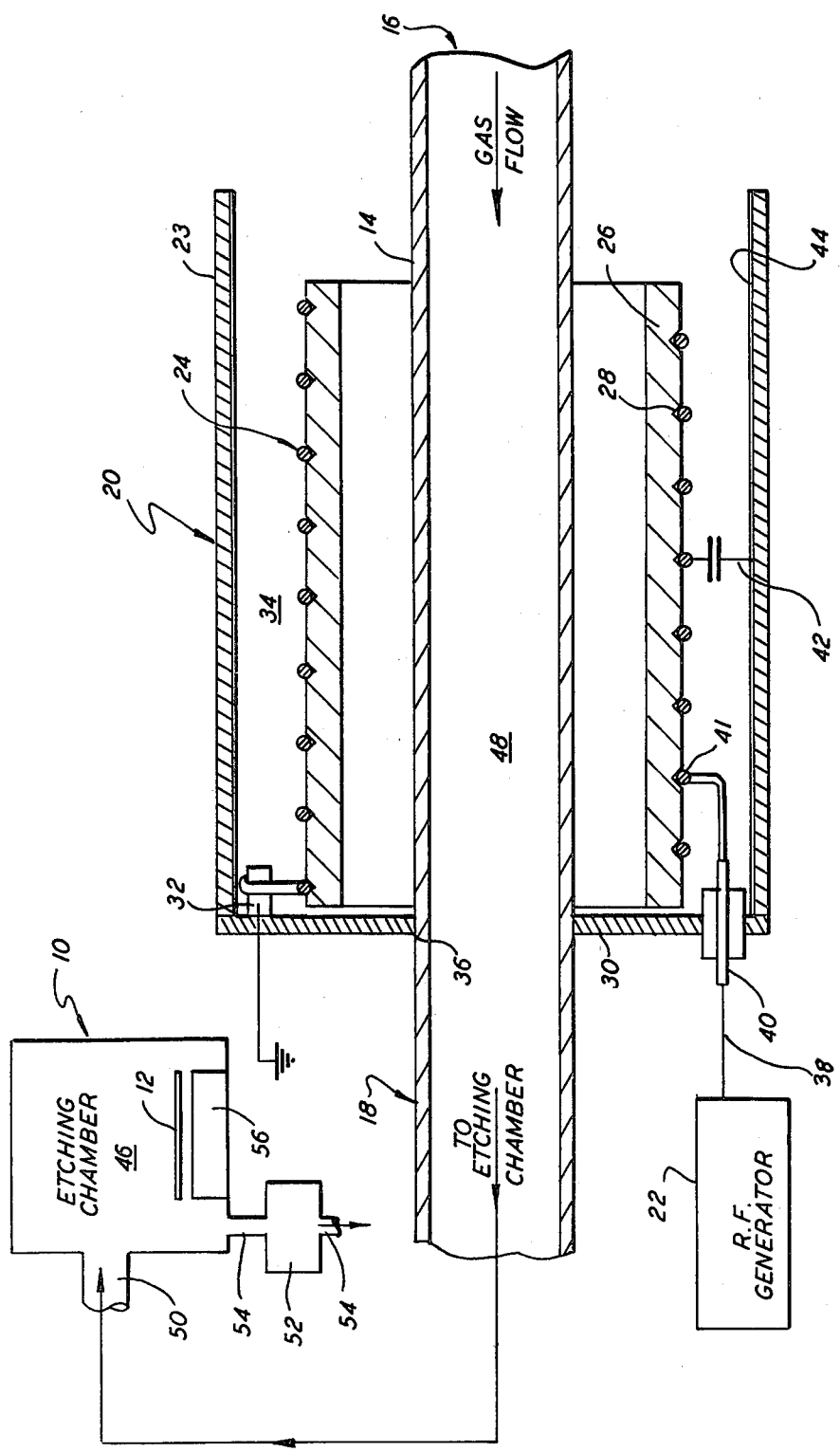

APPARATUS FOR THE ETCHING FOR SEMICONDUCTOR DEVICES

RELATED PATENTS AND PATENT APPLICATIONS

The present Application is a continuation-in-part Application of our Application Ser. No. 250,364, filed Apr. 2, 1981, entitled: "DISCHARGE SYSTEM FOR PLASMA PROCESSING."

BACKGROUND OF THE INVENTION

Plasma or dry etching is a well known technique used in the fabrication of integrated circuits wherein gas which has been dissociated into positive and negative ions and radicals react with unprotected areas of a material disposed on a substrate to remove elected portions of the material from the substrate. The etching generally takes place in a chamber containing the etching gas, which is formed into a plasma by the application of R.F. frequency power in a relatively low pressure environment.

Another etching technique often used in conjunction with the above technique is known as downstream etching. In this technique the plasma is created outside the main etching chamber in an auxiliary chamber with the reactive species being transported to the main chamber where the etching takes place. Downstream etching is a specialized form of etching and is used, e.g., to strip the remaining photoresist from the substrate as well as to remove materials such as polycrystalline silicon and silicon nitride. The foregoing etching is often used as a clean-up operation after the main etching has been accomplished.

A typical method for creating the plasma is to pass the etching gas through a tube with a portion thereof subjected to an electric discharge. Discharge in the flowing etching gas can be created at various frequencies with or without electrodes. Discharges employing electrodes suffer from the erosion of the electrodes which creates dust that adheres to the wafer. Electrodeless discharges attempted heretofore required devices to couple the energy into the discharge, which were expensive and required adjustment between starting and maintaining the discharge.

It is, therefore, an object of the present invention to create a new and improved device which creates an electrodeless discharge and which is self starting and requires no coupling device.

This and other advantages of the device of the invention compared to devices heretofore utilized for the above-stated purposes will become apparent as the discussion proceeds.

SUMMARY OF THE INVENTION

Briefly, our invention contemplates the provision of a new and improved apparatus for etching semiconductor devices comprising, in combination; an etching chamber containing the semiconductor device to be etched, and an electrodeless etching plasma forming chamber having an inlet connected to a source of continuous flowing etching gas and having an outlet connected to the etching chamber in fluid flow communication. A helical inductive resonator coupler is provided for coupling a source of R.F. electrical power into said electrodeless plasma forming chamber for continuously forming etching plasma from the etching gas flowing therethrough. In one form of the invention the helical inductive resonator coupler includes a grounded hollow cylinder of electrically conductive material with a grounded base member at one end; a helically coiled wire conductor concentrically mounted within the cylinder and spaced from the inner walls thereof; means for mounting the electrodeless etching plasma forming chamber substantially concentrically within the coil, the end of the coil toward said base member being grounded; and electrical coupling means for applying to the coil a source of R.F. electrical power that is sufficient to maintain a discharge in the plasma forming chamber mounted within the coil, said coupling means applying power into the coil at a position near, but spaced from, the grounded end thereof. This resonator is tuned to the frequency of the R.F. power by adjusting the coil length to be approximately equal to ¼ wavelength of the excitation frequency. The impedance of said plasma forming chamber and coupling means at said position then substantially matches the impedance of said R.F. power source, whereby when said R.F. power is applied to the coil, and before a discharge is ignited in the plasma forming chamber, a voltage maximum occurs at the end of the coil remote from said grounded end and creates a potential extending through the position of the plasma forming chamber between said end remote from the grounded end and said base member for ionizing the gas in the plasma forming chamber.

Further, according to an aspect of the invention pump means are provided which are connected to the etching chamber for evacuating said etching chamber at a predetermined rate. According to another aspect to the invention, the etching gas comprises 1 part $CF_4$ to 25 parts $O_2$ when photoresist is being stripped from the semiconductor device. According to another aspect of the invention the etching gases comprise 7 parts $CF_4$ and 2 parts $O_2$ when silicon is being etched.

There has thus been outlined rather broadly the more important features of the invention in order that the detailed description thereof that follows may be better understood, and in order that the present contribution to the art may be better appreciated. There are, of course, additional features of the invention which will be described more fully hereinafter. Those skilled in the art will appreciate that the conception on which this disclosure is based may readily be utilized as the basis of the designing of other apparatus for carrying out the purposes of this invention. It is important, therefore, that this disclosure be regarded as including such equivalent apparatus as do not depart from the spirit and scope of the invention.

One embodiment of the invention has been chosen for purposes of illustration and description and is shown in the accompanying drawing forming a part of this specification.

BRIEF DESCRIPTION OF THE DRAWING

The FIGURE is a side elevation, partially in section and partially schematic, showing a preferred embodiment of the present invention.

DETAILED DESCRIPTION OF A PREFERRED EMBODIMENT

In the embodiment of the invention illustrated in the drawing, apparatus for the downstream etching of a semiconductor device comprises, in combination, an etching chamber 10 containing a semiconductor device 12 to be etched. An electrodeless tubular etching plasma forming chamber 14 is provided, which has an inlet indicated at 16 connected to a source of continuously flowing etching gas and has an outlet indicated 18 connected to the etching chamber 10 in fluid flow communication. A helical inductive resonator coupler indicated at 20 is provided for coupling a source 22 of R.F. electric power into the electrodeless tubular etching plasma forming chamber for continuously forming etching plasma from the etching gas flowing therethrough.

A suitable type of inductive resonant coupler is shown in U.S. Pat. No. 3,873,884 issued Mar. 25, 1975, for example, the helical inductive resonant coupler 20 is made up of a hollow cylinder or shield can 23 of an electrically conductive material and a helical coil 24 wound on a ceramic or alumina tube coil form 26 with a spiral groove 28. One end of the cylinder 23, the right hand end is open; its other end is closed by a base member 30, which is also of electrically conductive material. The base member 30 is grounded at the R.F. connector 40 by the shield of the coaxial cable 38, and is fixed in the end of the cylinder so that the cylinder is electrically connected to the base member and thus similarly connected to ground.

One end of the coil 24, the left hand end as shown, is grounded by being connected to the base member as at the ground terminal 32; its other end is unconnected and thus open circuited. Preferably, the length of the wire of coil 24 is made one quarter of the wavelength of the R.F. electric power to be supplied by the R.F. generator 22. The diameter of the coil 24 is less than the inside diameter of the cylinder 23 so as to provide an annular air space 34 between them. The coil and cylinder are thus in a capacitor relationship. In practice, the relative diameters of the cylinder and coil may, for example, be approximately $4\frac{1}{8}$ inches and $2\frac{1}{4}$ inches, respectively, so that the gap therebetween is about 15/16 inch. The cylinder is preferably made slightly longer than the coil to provide a suitably long ground plane relative to the field of the last turn of the coil at its open-circuited end to avoid unwanted fringe effects. In the embodiment shown, the open end of the cylinder 23 extends beyond the amount necessary to avoid fringe effects.

The electrodeless etching plasma chamber 14 is concentrically mounted in the cylinder 23 as by means of the base 30, as indicated at 36.

R.F. electrical power is applied to the coil 24 from the R.F. generator 22, for example, by means of a coaxial cable 38, which passes through a connector 40 mounted in the base member 30 to a tap 41 into the coil. It is normally desired to have the plasma forming chamber 14 and coupler 20 spaced some distance from the R.F. generator 22 for flexibility of instrument design; in this case, as illustrated, the R.F. generator 22 is shown connected to the R.F. connector 40 through a coaxial cable 38. The R.F. generator is comparable to a conventional radio transmitter, which would be a suitable R.F. source. The R.F. generator 22 is operated from a conventional source of electric power, not shown, and in practice the R.F. generator is built to supply R.F. electrical power at 13.56 MHz at levels up to 300 to 400 watts and having an impedance of 50 ohms.

The tap 41 into the coil 24 is located relative to the grounded end of the coil so that when the plasma forming chamber is operating the impedance of the coupler and plasma forming circuit matches the impedance of the R.F. generator at the tap 41.

A trimming capacitor 42 may be provided between the wall of the cylinder 23 and the coil 24, as shown, to assist in providing a fine tune for adjusting the resonant frequency of the coupler and plasma forming circuit, when the plasma forming chamber is operating, to the resonant frequency of the R.F. generator. This capacitor may be eliminated by adjusting the resonant frequency of the generator, or by building the coupler 20 with a precision which makes additional trimming unnecessary.

As indicated hereinbefore, the length of the wire of the coil 24 is nominally one quarter of the freespace wavelength of the R.F. power to be supplied by the R.F. generator 22. The coupler and plasma forming chamber configuration of this invention thus provides a compact, quarter-wave, transmission line resonator which can be proportioned to have extremely low losses.

The coupler 20 has, due to the general configuration shown, a high electrical Q. This is enhanced by making the coupler of low loss materials and reducing losses by all practical means. In practice, the cylinder 23 and base member 30 are made of copper or brass and the interior of the cylinder is plated with a polished silver coating as indicated at 44 in the drawing, and the wire of the coil 24 is solid silver, copper wire or silver plated copper for the purpose of maintaining high R.F. conductivity. Also, soldered taps are avoided, the taps preferably being welded or silver soldered.

When the power from the R.F. generator 22 is first applied to the coupler 20 and the etching plasma has not yet started to form in chamber 14, i.e., discharge has not yet started, the resistance and reactance reflected by the discharge in the chamber 14 when the plasma forming process is in operation are absent. Because the plasma forming chamber is not extracting power and the coupler has a very high electrical Q and the open circuited end of the coil 24 is the location of a current node and hence a voltage maximum, the input R.F. voltage swing is transformed to a very high voltage (e.g., about ten thousand of volts) at the open circuited end of the coil. This high voltage creates a potential through the gas in the plasma forming chamber 14 to the grounded base member 30 of the cylinder which ionizes the gas. The electrostatic energy thus coupled into the plasma forming chamber is enough to ionize the gas and start the discharge.

When the discharge starts, the Q of the coupler 20 drops, the high voltage subsides and the plasma forming chamber is thereafter maintained in operation by power in the turns of the coil 24. If the discharge should extinguish, voltage builds up in the open circuited end of the coil again, and discharge will then automatically reignite. When the plasma forming chamber is operating, the voltage drop back as just described and the impedance of the circuit of the coupler 20 and the plasma forming chamber 14 then matches the impedance of the R.F. supply at the tap 41, thereby providing highly efficient operation of the plasma forming chamber.

The interior 46 of the etching chamber 10 communicates with the interior 48 of the tubular etching plasma forming chamber 14 via a conduit indicated at 50 in the drawing. The interior 46 of the etching chamber is connected to a pump 52 via a port 54 for evacuating gases and maintaining the pressure therein at a predetermined value suitable for etching. That is, in evacuating the gases from the etching chamber 10, the gases carry with them the products of etching. Within the chamber 10, this wafer 12 to be etched is disposed on a platform 56, provided for the purposes.

In operation, when the source of etching gases is connected to the electrodeless etching plasma forming chamber 14 and pump 52 is on, the etching gases flow into the interior 48 of the chamber 14. When the R.F. generator 22 is actuated, a plasma of the etching gas in its excited state flows into the interior 46 of the etching chamber 10 where they attack and remove the desired material from the wafer 12. When stripping photoresist from a wafer, the etching gas is composed of 1 part of $CF_4$ to 25 parts of $O_2$. When silicon is etched 7 parts of $CF_4$ to 2 parts of $O_2$ are used for the etching gas.

Also, for both of these processes, the pressure in the chambers 10 and 14 should be about 0.3 Torr (higher or lower pressures can be used) when gas is flowing and the discharge is on. Temperature of the wall of the tube 14 is approximately 40° C. and the temperature in the chamber 10 is approximately 23° C.

Although a certain particular embodiment of the invention is herein disclosed for purposes of explanation, various modifications thereof, after study of this specification, will be apparent to those skilled in the art to which the invention pertains.

What is claimed and secured by Letters Patents is:

1. Apparatus for etching semiconductor devices comprising, in combination:
   an etching chamber adapted to contain the semiconductor device to be etched;
   an electrodeless etching plasma forming chamber having an inlet connected to a source of continuously flowable etching gas and having an outlet connected to said etching chamber in fluid flow communication;
   a helical inductive resonator coupler for coupling a source of R.F. electrical power into said electrodeless plasma forming chamber for continuously forming etching plasma from the etching gas flowing therethrough, said helical inductive resonator coupler comprising:
   a grounded hollow cylinder of electrically conductive material with a grounded base member at one end thereof;
   a helically coiled wire conductor concentrically mounted within the cylinder and spaced from the inner walls thereof;
   means for mounting said plasma forming chamber substantially concentrically within the coil;
   the end of the coil toward said base member being grounded, and
   electrical coupling means for applying to the coil a source of R.F. electrical power that is sufficient to maintain a discharge in said plasma forming chamber mounted within the coil, said coupling means applying power into the coil at a position near, but spaced from, the grounded end thereof, said position being selected such that, when said plasma forming chamber is in operation by the R.F. power being applied to the coil, the impedance of said plasma forming chamber and coupling means at said position substantially matches the impedance of said R.F. power source, whereby when said R.F. power is applied to the coil, and before a discharge is ignited in said plasma forming chamber, a voltage maximum occurs at the end of the coil remote from said grounded end and creates a potential extending through the portion of said plasma chamber between said end remote from the grounded end and said base member for ionizing the gas in said plasma forming chamber.

2. Apparatus for the etching of semiconductor devices according to claim 1 wherein the end of said coil remote from the grounded end thereof is open circuited.

3. Apparatus for the etching of semiconductor devices according to claim 1 or claim 2 wherein the wire of the coil is about one-quarter wave long relative to the free space wavelength of the R.F. power intended to be applied for operating the plasma forming chamber mounted therein.

4. Apparatus for the etching of semiconductor devices according to claim 3, wherein the outside diameter of the coil is substantially one-half the inside diameter of the cylinder, the coil being of silver or copper wire and the interior of the cylinder being polished silver plating.

5. Apparatus for the etching of semiconductor devices according to claim 2, wherein the open end of the cylinder extends beyond the open circuited end of the coil at least sufficiently to avoid fringe effects.

6. Apparatus for the etching of semiconductor devices according to claim 1 or 2 wherein said base member extends across and substantially closes an end of the cylinder, the outside diameter of the coil and inside diameter of the cylinder being substantially $2\frac{1}{4}$ inches and $4\frac{1}{8}$ inches respectively, the wire of said coil being silver or copper, and the interior walls of the cylinder and base member being polished silver plating.

7. Apparatus for the etching of semiconductor devices according to claim 1, further including pump means connected to said etching chamber for evacuating said etching chamber at a predetermined rate.

* * * * *